United States Patent [19]
Lindsay

[11] Patent Number: 6,134,677
[45] Date of Patent: *Oct. 17, 2000

[54] METHOD AND APPARATUS FOR TESTING MEMORY DEVICES AND DISPLAYING RESULTS OF SUCH TESTS

[75] Inventor: Brent Lindsay, Boise, Id.

[73] Assignee: Micron Technology, Inc., Boise, Id.

[ * ] Notice: This patent is subject to a terminal disclaimer.

[21] Appl. No.: 08/915,074

[22] Filed: Aug. 20, 1997

Related U.S. Application Data

[63] Continuation of application No. 08/567,069, Dec. 4, 1995, Pat. No. 5,720,031.

[51] Int. Cl.$^7$ .................................................. G06F 11/00
[52] U.S. Cl. .................................................. 714/42
[58] Field of Search ................................ 714/42, 48, 57, 714/53, 46, 54

[56] References Cited

U.S. PATENT DOCUMENTS

| | | | |
|---|---|---|---|
| 4,450,560 | 5/1984 | Conner | 714/736 |
| 4,736,373 | 4/1988 | Schmidt | 714/723 |
| 4,816,750 | 3/1989 | Vanderkloot et al. | 714/738 |
| 4,857,833 | 8/1989 | Gonzlez et al. | 324/73 R |
| 4,876,685 | 10/1989 | Rich | 371/21.6 |
| 5,280,486 | 1/1994 | Arkin et al. | 371/29.1 |
| 5,408,628 | 4/1995 | Ameti | 395/425 |
| 5,535,164 | 7/1996 | Adams et al. | 365/201 |
| 5,588,115 | 12/1996 | Augarten | 714/42 |
| 5,720,031 | 2/1998 | Lindsay | 714/42 |

OTHER PUBLICATIONS

"Product Reliability," *DRAM Data Book*, Chap. 7, Micron Technology, Inc., Boise, ID, 1992, pp. 1–14.

J900 Series Test Systems, Bitmap Tool Manual V2.5, Teradyne, Inc., Agoura Hills, CA, Apr. 1993, pp. 1–26 and I.1–I.4.

Donaldson, John F., *Using Bitmap B2.50*, Teradyne, Inc., Agoura Hills, CA, Aug. 10, 1992, pp. 1–28.

*J990 Series Memory Test Systems, Catch RAM Manual*, Teradyne, Inc., Agoura Hills, CA, Oct. 1993, pp. 1.1.1–1.2.8; 2.1.1–2.1.22; 3.1.1–3.1.48; 3.2.1–3.2.6; 3.3.1–3.3.12; 4.1.1–4.1.12; 4.2.1–4.2.8; 4.3.1–4.3.32; 4.4.1–4.4.16.

van de Goor, A.J., *Testing Semiconductor Memories*, John Wiley & Sons, Chicester, UK, 1991, pp. 65–88, 237–257, 259–267, 269–284, 425–436, 473–476, 489–501.

*Primary Examiner*—Robert W. Beausoliel, Jr.
*Assistant Examiner*—Pierre E. Elisca
*Attorney, Agent, or Firm*—Dorsey & Whitney LLP

[57] ABSTRACT

An apparatus and method for testing a semiconductor device allows error data to be displayed, in real time, based on the physical locations of the errors on the semiconductor device. A mapping circuit includes a router circuit, an error catch memory, and a topological circuit. The router circuit converts logical addresses employed by the semiconductor device to physical addresses employed by the error catch memory so that error data is appropriately routed from locations in the semiconductor device to corresponding locations in the error catch memory. The topological circuit then converts the physical addresses of the error data in the error catch memory to spatial addresses for allowing a host computer to rapidly display such errors as a bit map display on a visual display device. The router and topological circuits are preferably field programmable gate arrays or programmable read only memories so that the host computer can reprogram them for different semiconductor devices to be tested.

23 Claims, 11 Drawing Sheets

VD1 ———— EDC1
VD2 ———— EDC2
VD3 ———— EDC3
VD4 ———— EDC4

METHOD AND APPARATUS FOR TESTING MEMORY DEVICES AND DISPLAYING RESULTS OF SUCH TESTS

CROSS-REFERENCE TO RELATED APPLICATION

This application is a continuation of U.S. patent application Ser. No. 08/567,069, filed Dec. 4, 1995 now U.S. Pat. No. 5,720,031.

TECHNICAL FIELD

The present invention relates to apparatus and methods for testing electrical devices, particularly semiconductor memory devices.

BACKGROUND OF THE INVENTION

Various types of errors can occur during the manufacture of semiconductor devices. As circuit density on semiconductor devices increases, the number of these errors can increase. For quality control and to improve yields of commercially acceptable semiconductor devices, the semiconductor devices are tested, often before a die containing the device is packaged. A series of probes on a test station contact pads on the die to thereby access portions of the semiconductor device.

For example, in a semiconductor memory device, the probes contact address pads to access selected memory cells in the memory device. A predetermined set or pattern of data is typically written to selected addresses that correspond to certain memory cells, and then the data is read from those memory cells to determine if the read data matches the data written to that address. If the read data does not match the written data, then the memory cells at the selected addresses are likely faulty.

A person testing several dies on the wafer can then examine a particular die itself, by means of a microscope, to determine the reason for such errors, e.g., whether the errors occurred from masking defects, during deposition of certain layers, and so forth. During the initial development of a semiconductor device, many different changes can be made to compensate for detected errors, including making changes to certain masks. Once a semiconductor device is in production, however, redundant circuitry on the semiconductor device can be employed to compensate for only certain detected errors.

One known apparatus for testing semiconductor wafers, manufactured by Teradyne Corporation, employs a test bed that receives the wafer, probes that contact the pads on each die in the wafer, and testing circuitry for applying addresses and writing data to, and reading data from the dies by means of the probes. An error catch memory stores comparison signals from an error compare circuit that reflect errors located in the semiconductor wafer ("error data"). The error catch memory also receives addresses from an address generator circuit of locations on the die at which the errors occurred, such as the row and column or "logical addresses" of memory locations in a memory cell. A host computer retrieves the error data and the logical addresses from the error catch memory and displays the error data on a visual display such as a raster display CRT.

The host computer in the Teradyne apparatus maps the error data to spatial locations on the display device that correspond to physical locations on the die. As a result, the visual display shows an enlarged view of the die containing the semiconductor device and the locations on the semiconductor device that produced the error data (e.g., the locations of faulty memory cells). The person testing the semiconductor device can then see the locations of the errors on the device from the visual display and therefrom know where to inspect on the die to examine certain memory cells that produced the errors. The person can thereby possibly uncover manufacturing defects in the die.

Often, semiconductor devices employ logical addressing schemes that do not correspond to X and Y axis spatial locations on a visual display device. In a bitmapped display, the top leftmost pixel typically has a minimum coordinate value such as (0,0), while the lower right-hand pixel has a maximum coordinate value such as (528, 727). In a typical memory device, employing only a single array of memory cells, a lower right corner of the array instead could have a minimum logical row and column address of (0,0) for the first bit in the device, while the upper right could have a maximum logical address that corresponds to the size of the array. A simple mapping algorithm is necessary to map the memory array locations to bitmap coordinates on the visual display.

Many complex memory devices produced today employ 16 or more arrays of memory cells on a single semiconductor device. Each array in the semiconductor device could itself have a logical addressing scheme that differs from those of neighboring arrays on the device. As a result, the host computer in the Teradyne apparatus must perform even more complex algorithms to map the logical addresses at which the errors occurred on the semiconductor device to spatial locations or "spatial addresses" on the visual display, which correspond to physical locations on the die at which the errors occurred. In other words, the host computer in the Teradyne apparatus must convert the logical addresses of a semiconductor device being tested to physical addresses, which correspond to physical locations on the device, and then convert the physical addresses to spatial addresses for bitmap display on the display device.

The complex algorithm employed by the host computer is inherently slow, particularly when many mapping algorithms must be performed for many addresses in a complex semiconductor memory device. If a person conducting the test desires to change addresses on the semiconductor device or input different parameters (e.g., higher voltage values), these addresses/parameters must be input to the testing circuitry, the testing circuitry initiated, and then the host computer must again perform the mapping algorithms to display new error data on the visual display. This process is inherently time consuming as a result of the logical-to-physical and physical-to-spatial mapping algorithms required to properly display error data on the display device. With a large number of dies to test on a single semiconductor wafer, and many memory locations on a given die itself to test, the time consuming process required by the Teradyne testing apparatus requires many man hours.

The time consumptive nature of this prior art method is exacerbated by the need to reload a different routine or employ a different testing circuit for different semiconductor devices, some of which may be on a single wafer. Therefore, if a memory device employing four memory cell arrays is initially tested, and then a memory device employing 16 memory cell arrays is later tested, a different algorithm must be loaded into the host computer and the testing circuitry must be modified for the new memory device before the 16 array device can be tested.

SUMMARY OF THE INVENTION

The present invention provides an apparatus and method for testing a semiconductor device, and in real-time, displaying the spatial locations of errors on a display device, where the locations of the errors on the display device correspond to physical locations on a die containing the semiconductor device. The present invention preferably employs a field programmable gate array ("FPGA") or hardware implemented look-up table for rapidly routing the error data received from an error compare circuit to an error catch memory in a manner such that the error data is stored in the error catch memory at physical addresses that correspond to logical addresses employed by the device being tested. As a result, the router circuit continually routes error data to particular physical locations in the error catch memory. A topological circuit, such as an FPGA, remaps the physical locations of the error data from the error catch memory to spatial locations for display on a bitmapped display device such as a CRT. Therefore, the topological circuit can also continually route the error data from the error catch memory, through the host computer, for display on the display device. Overall, the router circuitry continually routes the logical addresses of error data to appropriate physical addresses in the error catch memory for the device being tested, while the topological circuitry continually maps the physical addresses of the error data to spatial addresses for display on the bitmap display device, all while the host computer is performing other functions such as applying a test pattern to the device, controlling the display device, etc.

By being implemented in hardware, the router and topological circuits are considerably faster than the prior art approach of performing routines by the host computer. Additionally, the router and topological circuits can operate in parallel with the host computer, thereby improving the overall speed of the testing apparatus of the present invention. As a result, while the Teradyne system requires a mainframe or supercomputer for fast testing of complex semiconductor devices, the present invention can employ a minicomputer or personal computer as its host computer, thereby realizing a much more cost-effective testing apparatus. Moreover, since the router and topological circuits are programmable, the host computer can, at any time, reprogram them for different semiconductor devices to be tested, even during the testing of a given device. As a result, the testing apparatus of the present invention is exceptionally fast, flexible and able to provide true physical mapping of the device being tested.

In a broad sense, the present invention embodies an apparatus for assisting in the display of locations of errors in a semiconductor device on a display device for use in a testing system, the testing system having a computer and a visual display device. The semiconductor device has a plurality of memory locations, each addressable by logical addresses.

An error catch memory has a plurality of memory cells for storing error data, the error data corresponding to a comparison between data written to the plurality of memory locations in the semiconductor device, and data read from the plurality of memory locations. Each memory cell of the error catch memory is addressable by a physical address.

A programmable router circuit is coupled to the error catch memory and the semiconductor device. The programmable router circuit converts the logical addresses to physical addresses. The programmable router circuit thereby routes for storage the error data from the plurality of memory locations in the semiconductor device to selected memory cells in the error catch memory.

A programmable topological circuit is coupled to the error catch memory and the computer. The programmable topological circuit receives spatial addresses from the computer, and converts selected spatial addresses to selected physical addresses. The programmable topological circuit provides error data corresponding to the selected physical addresses to the computer in response to the spatial addresses. The programmable topological circuit thereby allows the error data from the semiconductor device to map to spatial addresses on the display device for displaying the locations of errors in the semiconductor device.

The present invention also embodies a method of testing a semiconductor memory device and displaying on a display device spatial locations of errors in the semiconductor device. The semiconductor device has a plurality of memory locations each addressable by logical row and column address signals. The method includes the steps of: (i) loading a routing routine into a routing circuit for converting the logical addresses of the semiconductor device to physical addresses, the routing routine being based on a layout of memory locations in the semiconductor memory device; (ii) loading a mapping routine into a topological circuit for converting spatial addresses to physical addresses, the mapping routine being based on a layout of a plurality of memory cells in an error catch memory; (iii) continually applying a test pattern to the semiconductor device, determining error data from the semiconductor device and routing the error data to the error catch memory based on the routing routine; and (iv) substantially simultaneous with the step of continually applying a test pattern, constantly reading the error data from the error catch memory and displaying the error data at spatial locations on the display device based on the mapping routine.

The present invention furthermore embodies an apparatus for assisting in the display of locations of errors in a semiconductor device on the display device, the semiconductor device having a plurality of circuit locations addressable by logical addresses. The apparatus includes an error catch memory having a plurality of memory cells for storing the error data derived from the semiconductor device. A programmable router circuit is coupled to the error catch memory and the semiconductor device. The programmable router circuit converts the logical addresses to physical addresses to thereby route for storage the error data from the plurality of circuit locations in the semiconductor device to select the memory cells in the error catch memory. The error catch memory also provides error data corresponding to selected physical addresses to the computer in response to spatial addresses from the computer to thereby allow the error data from the semiconductor device to map to spatial addresses on the display device for displaying the locations of errors in the semiconductor device.

The present invention allows testing to be performed quickly and automatically over a wide array of semiconductor devices. Error mapping circuitry is electrically programmably reconfigurable so as to be modified to rapidly route error data from any number of semiconductor devices that may be tested to video memory for display on a display device. Other features and advantages under the present invention will become apparent from studying the following detailed description of the presently preferred embodiment, together with the following drawings.

DETAILED DESCRIPTION OF THE PRESENTLY PREFERRED EMBODIMENTS OF THE INVENTION

Figure 1:
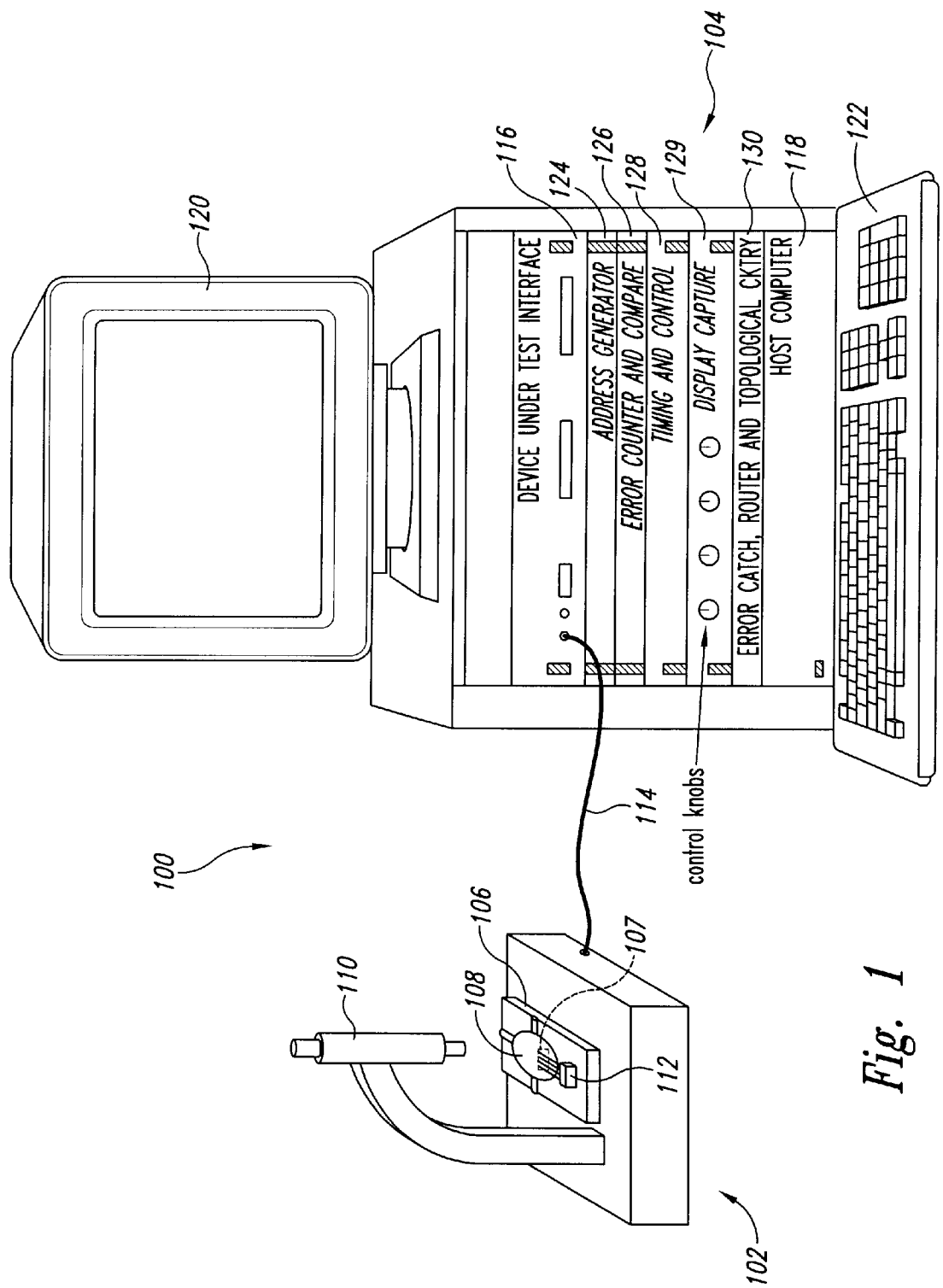
FIG. 1 is an isometric view of a testing apparatus of the present invention.

Referring to FIG. 1, a testing apparatus 100 of the present invention includes essentially two stations, a testing station 102 and an analysis station 104. A test bed 106 in the testing station 102 releasable secures a wafer 108, which has one or more dies or semiconductor devices, including a device 107 formed thereon. The test bed 106 can have a motor-controlled securing device for moving the wafer under control of the analysis station 104. A microscope 110 positioned over an upper surface of the wafer 108 allows a user to visually inspect desired portions of the devices 107 on the wafer.

A series of test probes 112 electrically couple to pads on the device 107 to provide means for writing addresses and data to, and reading data from, semiconductor circuits on the device 107 in the wafer 108. One or more cables electrically and/or optically couple the probes 112 and the test station 102 to the analysis station 104.

A device under test interface 116, which forms part of the analysis station 104, provides appropriate routing, scaling, amplification or other signal processing for signals written to, or read from, the device 107. A host computer 118, having a visual display device 120 such as a CRT, and a keyboard 122, performs most operations in the analysis station 104. The host computer 118 produces test data or a test pattern which is applied to the device 107 on the wafer 108 being tested (i.e., the device under test or "DUT"). An address generator 124 provides addresses for writing data to, and reading data from, the device 107. An error counter and comparator 126 compares the data written to the device 107 to the data read from the device to determine if an error has occurred, and increments a counter for each such error.

A timing and control circuit 128 provides the appropriate signals for reading to and writing from the device 107. A display capture and adjustment circuit 129, having several programmable control knobs, provides means for adjusting analysis and display parameters such as zooming into, and out of, display of the device 107 as the device is displayed on the display device 120. Error mapping circuitry 130 provides the mapping of logical-to-physical addresses, and physical-to-spatial addresses, as described in more detail below. The analysis station 104 is generally shown as a series of rack-mounted components to represent the electrical interconnection between the host computer 118 with the device under test interface 116, address generator 124, error comparator circuitry 126, timing and control circuitry 128, display capture and adjustment circuitry 129 and error mapping circuitry 130. The host computer 118 is preferably a microcomputer or personal computer, while the device under test interface 116, address generator 124, error comparator 126, timing and control circuitry 128 and display capture and adjustment circuitry 129 are generally known by those skilled in the semiconductor testing art.

Figure 2:
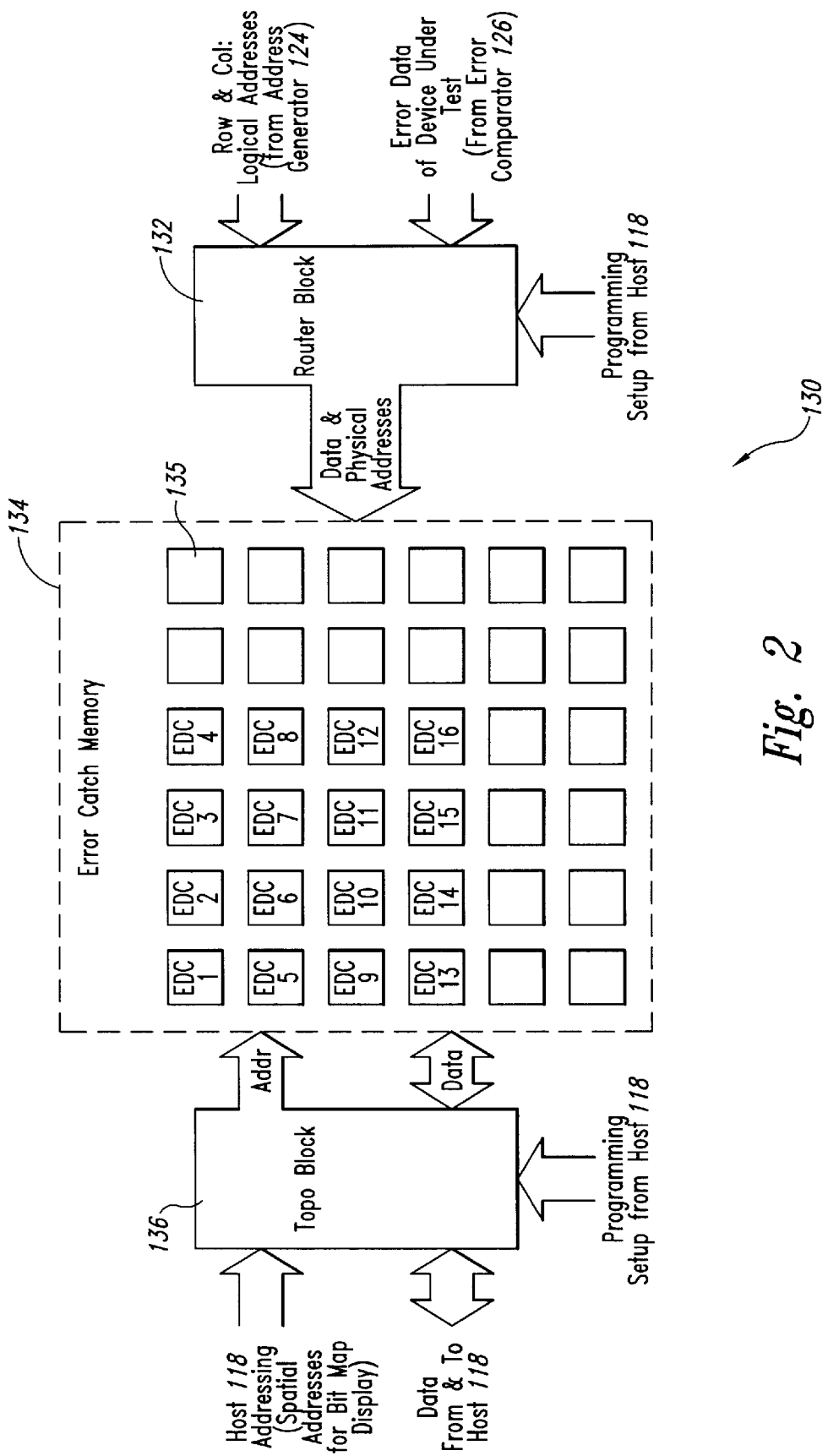
FIG. 2 is a block diagram of an error mapping circuit of the testing apparatus of FIG. 1 having an error catch memory, routing circuitry and topological circuitry.

Referring to FIG. 2, the error mapping circuitry 130 includes a router block or circuitry 132 that receives row and column logical addresses from the address generator 124, and receives the error data regarding the device 107 from the error comparator 126. As explained in more detail below, the router circuitry 132 maps the logical addresses of the device 107 to physical addresses for storing the error data in an error catch memory 134. The error catch memory 134, preferably high-speed random access memory ("RAM"), stores the error data produced from the device 107 in physical locations that correspond closely to the physical locations of memory cells, or arrays of memory cells, in the device. (The terms "location" and "address" are often used interchangeably herein.) Therefore, as shown in FIG. 2, the error catch memory 134 contains a large two-dimensional array of blocks 135 of memory cells. FIG. 2 shows an exemplary 6×6 array of memory cell blocks 135, a total of 36 blocks, for the error catch memory 134.

Each block 135 of memory in the error catch memory 134 preferably has a separate input error channel for data. To be flexible and thereby be adaptable to various types of semiconductor devices to be tested, the error catch memory 134 can have a substantially larger number of memory blocks 135, each block having a relatively small number of memory cells. As a result, the router circuitry 132 can be configured so that routing of error data causes several blocks 135 of the error catch memory 134 to be grouped together for storing the error data from a larger memory array in the device 107. For simplicity, however, and as described more fully below, sixteen of the blocks of memory in the error catch memory 134 are shown as having error channels ED1–ED16 for storing error data from sixteen blocks of memory in the device 107.

A topological block or circuitry 136 receives spatial addresses from the host computer 118 for addressing error data in the error catch memory 134 for display on the display device 120. The topological circuitry 136 maps the spatial addresses received from the host computer 118 to the appropriate physical address in the error catch memory 134, and thereby accesses the appropriate error data from the memory. After mapping the spatial address from the host computer 118 to physical addresses in the error catch memory 134, the topological circuitry 136 then relieves the appropriate error data to be displayed or stored in video memory (not shown) in the host computer 118 which drives the display device 120. As a result, the topological circuitry 136 properly maps the error data in the error catch memory 134 to the video memory in the host computer 118 so that the physical addresses or locations of the error data in the error catch memory 134 are stored in the video memory for proper display at spatial locations on the display device 120.

For example, the top left-most pixel of the display device 120 can have a spatial address of (0,0), which corresponds to row and column address (0,0) in the video memory. To display this pixel on the display device 120, the host computer 118 requests data at address (0,0) from the error catch memory 134 for storage at row and column address (0,0) in the video memory. The topological circuitry 136 receives the spatial address request from the host computer 118 and, based on the orientation of the device 107 in the test bed 106, retrieves the appropriate error data bit from the error catch memory 134 so that error data for the upper left-most memory cell in the device is displayed at this pixel. Due to the differences in addressing between the physical addresses of the error catch memory 134, and the spatial addresses of the display 120 (or video memory), the topological circuitry 136 must translate or map the spatial addresses received from the host computer 118 into appropriate physical addresses so that the appropriate error data is retrieved from the error catch memory 134 for appropriate display on the display device 120.

Importantly, the host computer 118 continually and sequentially applies the preselected test pattern to the device 107, typically from an initial row and column address of (0,0) through increasing addresses (in row and/or column fashion). Similarly, the host computer 118 continually addresses the error data stored in the error catch memory 134 for its display on the display device 120 in a similarly incrementing sequential addressing method. As a result, the router circuitry 132 continually routes the error data received from the error comparator 126 to appropriate locations in the error catch memory 134, as the incoming addresses are sequentially incremented. Similarly, the topological circuitry 136 continually maps the error data from the error catch memory 134 to video memory in the host computer 118 in response to sequential addresses received by the host computer, so that the stored error data is appropriately displayed on the display device 120.

Figure 3:
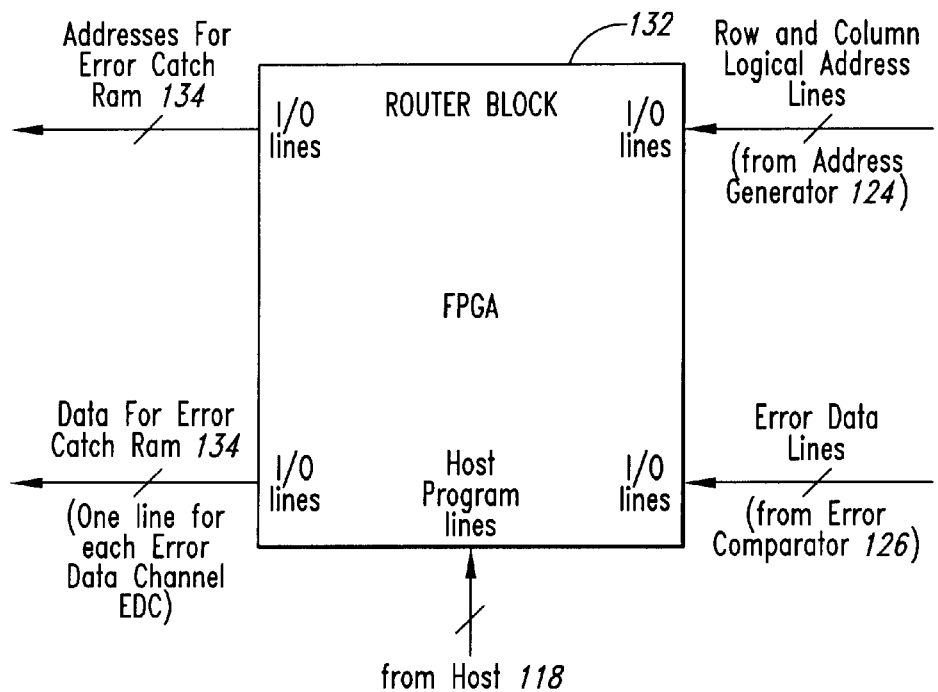
FIG. 3 is an enlarged block diagram of the router circuitry of FIG. 2.
Figure 4:
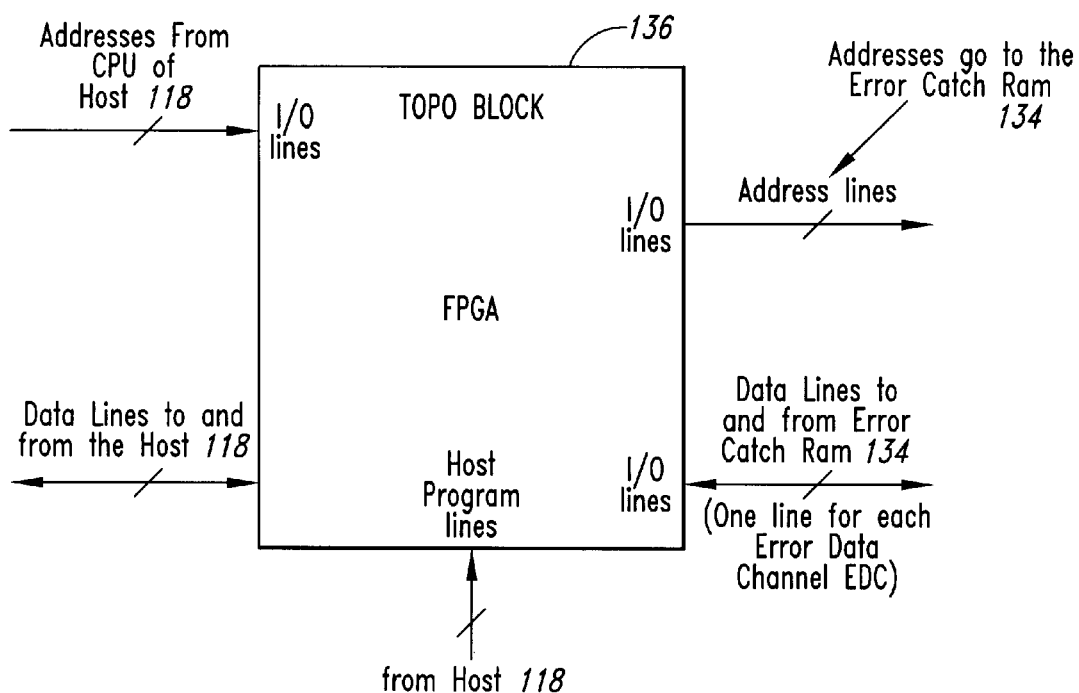
FIG. 4 is an enlarged block diagram of the topological circuitry of FIG. 2.

As explained more fully below, the router and topological circuits 132 and 136 must be programmed to perform the particular routing and mapping of logical addresses to physical addresses, and physical addresses to spatial addresses, for each semiconductor device to be tested. As a result, the router and topological circuits 132 and the router circuitry 136 are preferably field programmable logic or gate arrays ("FPGAs"), as shown in FIGS. 3 and 4, respectively.

FPGAs typically have an array of logic modules interspersed with a programmable interconnect architecture. Under the present invention, the logic modules themselves are preferably programmable. Input/output pads for the FPGA may be programmable to be an input, an output, or a bidirectional I/O circuit for use in a bus which connects with the host computer 118 and the error catch memory 134. FPGAs allow logic designs of relatively low complexity to be readily implemented and reprogrammed using known software provided with such arrays. As a result, FPGAs allow a variety of logic circuits to be implemented using a single device. Different programming technologies, such as anti-fuses, non-volatile memory elements, memory element controlled switches, etc., can be used in FPGAs. Overall, FPGAs are known by those skilled in the art, and the present invention preferably employs static random access memory ("SRAM") implemented FPGAs so that they can be readily programmed by the host computer 118.

The host computer 118 performs a programming setup for the router circuitry 132 and topological circuitry 136 for each type of semiconductor device tested, since each type of device likely has its own particular physical layout that differs from a sequentially incremented logical address scheme employed by the host. The host computer 118 therefore programs the router circuitry 132 as a predetermined set of logic gates, as described below, to accommodate the layout of the device 107. Additionally, the host computer 118 programs the topological circuitry 136 as a predetermined set of logic gates to accommodate the differences in layout between the coordinates of the bit map display of the display device 120, and its corresponding video memory in the host computer 118, and the layout of the error catch memory 134.

Figure 5:
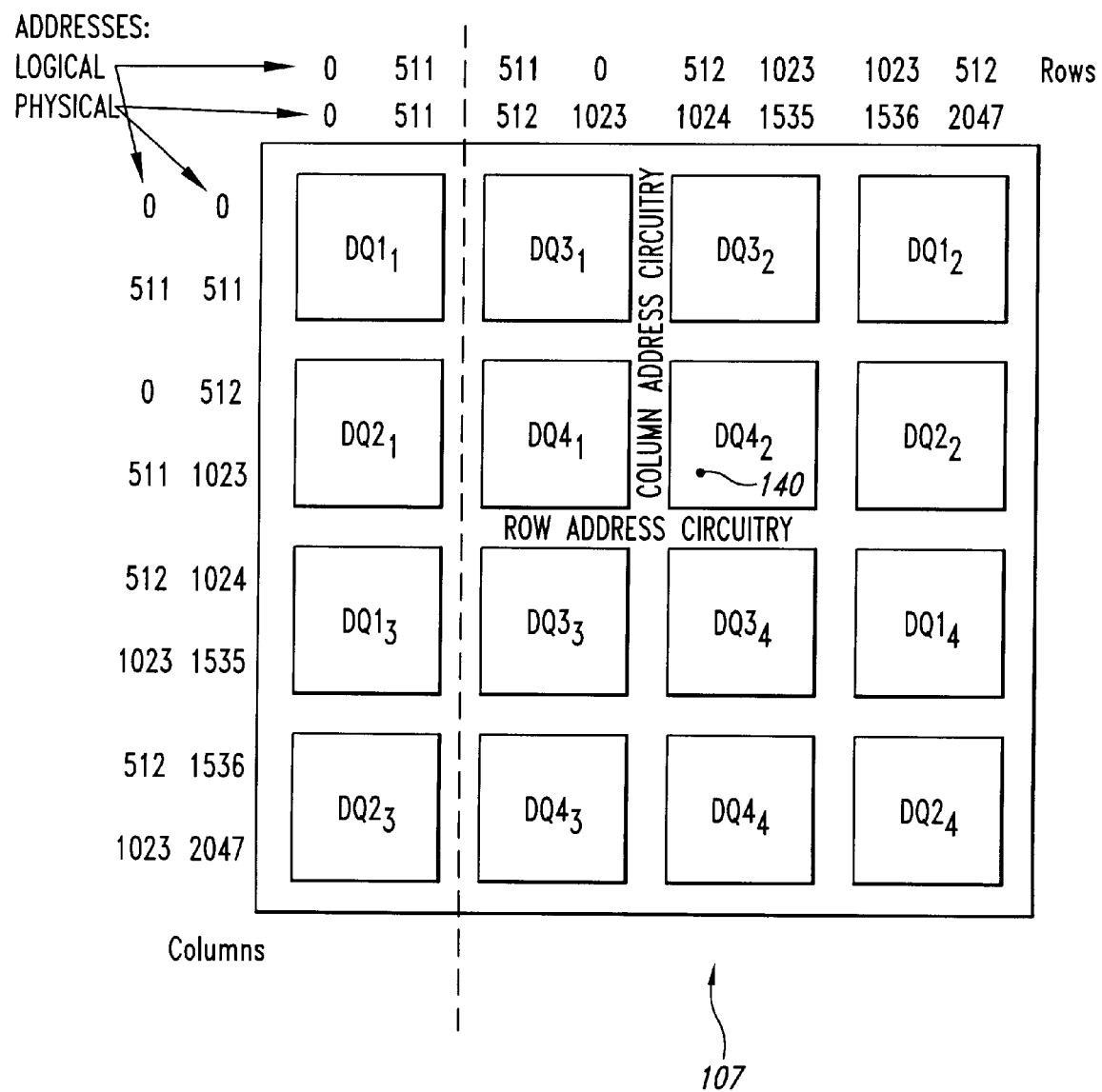
FIG. 5 is a block diagram of a one megabit by four semiconductor memory device, which shows logical and physical addresses for memory cells in the device, the device being capable of being tested by the testing apparatus of FIG. 1.

Referring to FIG. 5, an exemplary block diagram of a one meg by four semiconductor memory device is shown having four memory cell arrays DQ1–DQ4 that are each subdivided into four blocks, represented by subscripts "1" through "4". By dividing the memory into four memory cell arrays DQ1–DQ4, data is multiplexed so that each memory array is addressed by its own data line, and therefore the device 107 has four data lines DQ1–DQ4. As is known in the art, during a write cycle, the host computer 118 causes a four bit byte of test data to be driven onto the data lines DQ1–DQ4 for storage in each of the corresponding memory arrays DQ1–DQ4, based on a logical address the host simultaneously applies to the device. The device 107 stores one bit of the test data byte in a particularly addressed memory location in each of the four memory arrays DQ1–DQ4. Since the device 107 is a one megabit by four memory device, 1,024 row lines and 1,024 column lines are used to access one of over 1 million memory cells in each of the four memory cell arrays DQ1–DQ4.

As shown along the top and left side of the device 107 in FIG. 5, the logical addresses for accessing the various blocks of memory cells differs from the physical addresses of such memory cells. For example, if the device 170 were simply a four megabit by one memory device, the logical addresses could be equivalent to the physical addresses, so that the first memory location in the upper left corner of the block $DQ1_1$ of memory locations would have a logical and physical address of (0,0) which corresponds to the row and column address, and x and y axis physical locations, of the memory cell, all respectively. Similarly, in this example, the most lower right hand memory location in the block $DQ2_4$ would have the logical and physical address of (2047,2047).

For reasons of fabrication ease, to reduce line capacitances, and to improve the overall performance of the device 107, the blocks of memory cells, for the four arrays of memory cells DQ1–DQ4, are arranged in predetermined patterns. For example, a single memory location 140 in the memory block $DQ4_2$ has a logical row and column address of (384,640), but has a physical address or location of (1152,896). As shown, the logical row addresses for bits 0–511 ascend from left to right for the block $DQ1_1$, but its adjacent block $DQ3_1$ has row addresses that descend from left to right from 511 to 0. A vertical dashed line shown in FIG. 5 helps visually show that the memory blocks are mirrored in the device 107. In other words, the blocks $DQ1_1$, $DQ2_1$, $DQ1_3$ and $DQ2_3$ are accessed by logical row addresses 0–511 in left to right order, while the memory cell blocks $DQ3_1$, $DQ4_1$, $DQ3_3$, and $DQ4_3$ are accessed by logical row addresses 511–0 from left to right. The other columns of memory blocks are similarly mirrored in the device 107. Other semiconductor devices known by those skilled in the relevant art have similar mirrored layouts, or other arrangements of memory blocks.

Figure 6:
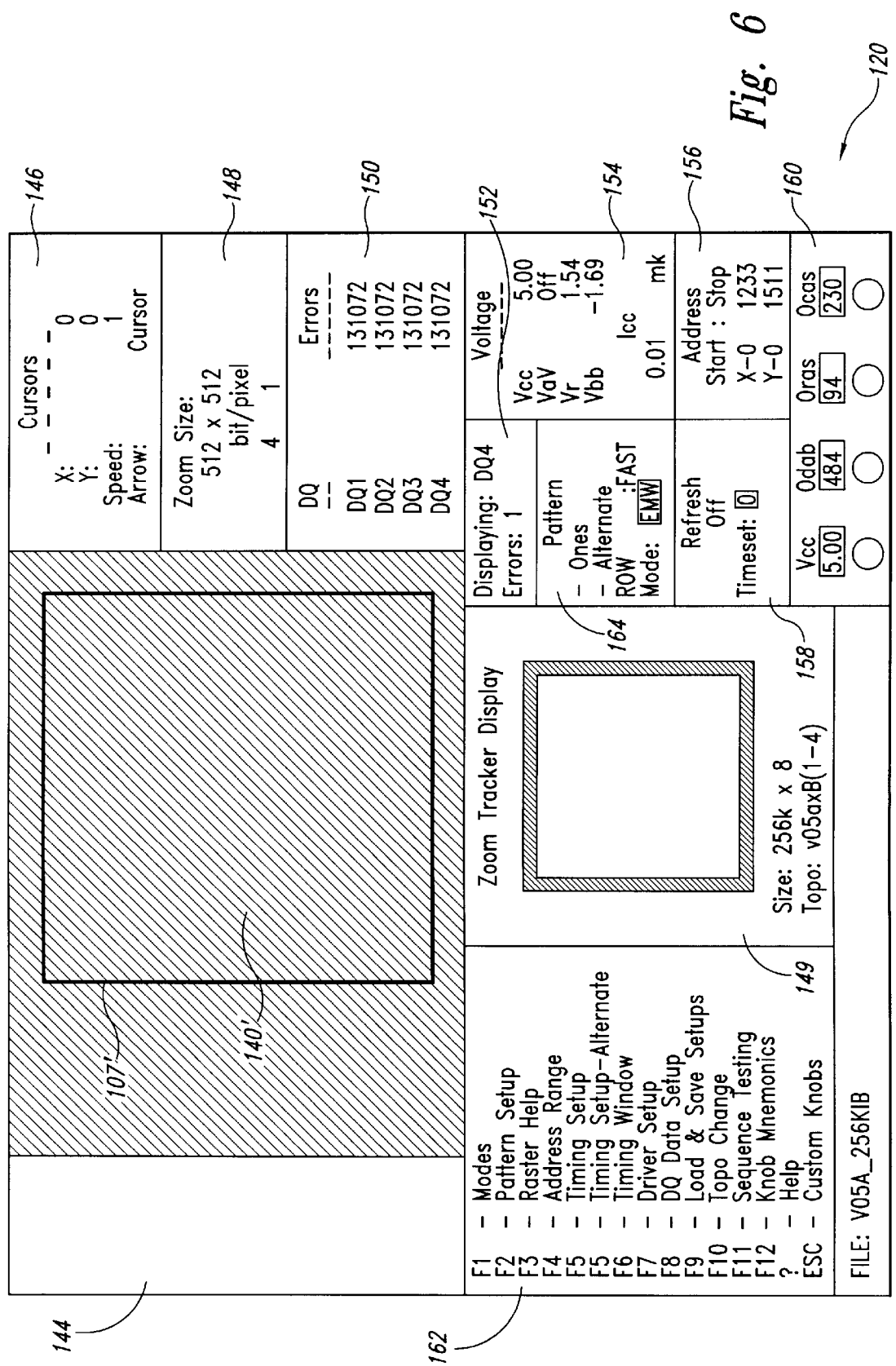
FIG. 6 is a front view of a visual display device of the testing apparatus of FIG. 1.

Referring now to FIG. 6, an exemplary front view of the visual display 120 for displaying error data for the device 107 has a raster or bit map display portion 144. The bitmap display portion 144 includes a visual representation of the memory device 107 as a large square, with the exemplary memory location 140 noted above being shown as a dot 140', if the memory location were flagged as an error. The display 120 also has various positions that provide the user with a display of relevant information during the testing of the device 107. A portion 146 of the display 120 shows the cursor position. A portion 148 of the display 120 shows a size of the zoom for the bit map display portion 144 (in bits/pixel), and a portion 149 shows a zoom tracker display which shows the location of the zoom, thereby allowing a user to zoom into a particular portion of the device 107.

A portion 150 shows a total number of errors for each memory cell array DQ1–DQ4, while a portion 152 displays the status of the errors currently being displayed. A portion 154 shows the values of various input and output voltages for the power supply to the device 107. A portion 156 shows the size, in logical addresses, of the area displayed in the bitmap display portion 144. A portion 158 shows a refresh rate of the display 120.

A portion 160 shows a representation of the four knobs of the display capture circuitry 129 (FIG. 1) with a value of a corresponding parameter assigned to the knob. Importantly, the knobs can be programmed by the analysis station 104 to allow a user to adjust the parameters of input signals applied to the device 107, and under the present invention, view in real time the results of such changes. For example, the user can adjust the power supply voltage Vcc to see how changes in the voltage affect the device 107. Finally, a portion 162 shows a quick reference of the functions assigned to function keys F1–F12 of the keyboard 122, while portion 164 shows the particular test pattern being applied by the host computer 118 to the device 107.

Figure 7:
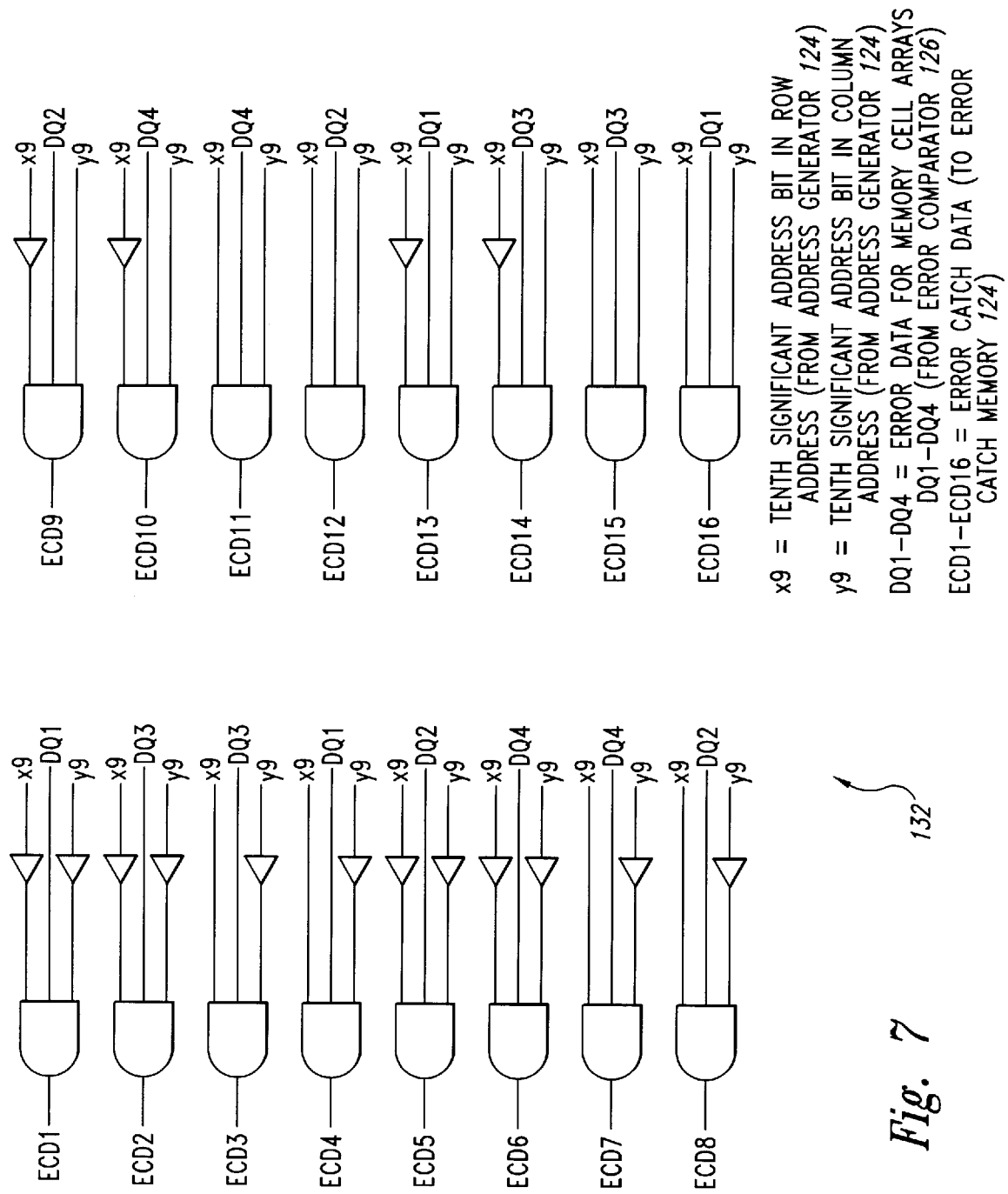
FIG. 7 is a schematic diagram of a logical gate array programmed into the router circuitry of FIG. 3 by the host computer based on the memory device of FIG. 5.

As explained above, the router and topological circuits 132 and 136 are programmed by the host computer 118 to emulate predetermined networks of logic gates to provide routing of logical to physical addresses and mapping of physical to spatial addresses. FIG. 7 shows an example of a set of logic gates programmed by the host computer 118 and emulated in router circuitry 132. As shown in FIG. 7, the router circuitry 132 is programmed to emulate sixteen 3-input AND gates, some of which have inverting inputs. Each of the AND gates provides an error channel output to one of sixteen blocks 135 of memory ECD1–ECD16 in the error catch memory 134 (FIG. 2). Two of the three inputs to the AND gates are selected bits of addresses received from the address generator 124, while the third input is error data received from one of the four memory arrays DQ1–DQ4 from the device 107 (received through the error comparator 126). The two address inputs are either inverted or not inverted so that the AND gates receive different combination of the two address inputs.

The two address inputs are the tenth bits of 11-bit row and column address (shown as "X9" and "Y9" for the row and column logical addresses, respectively). Therefore, when the decimal logical row address changes from 511 to 512, the tenth significant bit X9 in the binary logical row address changes from 0 to 1 (i.e., from "00111111111" to "01000000000."). As a result, the logic gates emulated by the router circuitry 132 switch from outputting error data over error channels ECD1, ECD2, ECD5, ECD6, ECD9, ECD10, ECD13 and ECD14 to outputting error data over error channels ECD3, ECD4, ECD7, ECD8, ECD11, ECD12, ECD15 and ECD16 to the respective block 135 in the error catch memory 134 (see FIG. 2). (The remaining blocks of memory in the error catch memory 132, and therefore other error channels to such memory, are ignored by the router circuitry 132.) By using programmed logic gates, rather than software routines, the router circuitry 132 can rapidly route error data from the blocks of memory in the four memory arrays of the device 107 to corresponding blocks of memory in the error catch memory 134. (For ease of understanding, the router circuitry 132 is described at times herein as retrieving error data from the device 107; in actuality, as described above, the error data is received from the error comparator 126.)

Importantly, the router circuitry 132 attempts to route the error data from the locations of the data in the device 107 to corresponding locations in the error catch memory 134 so that the layout of the error data in the error catch memory is physically arranged in a manner similar to its layout in the device, despite differences in addressing employed between the error catch memory and the device. As a result, the error catch memory attempts to emulate the exact layout of the device.

The above-described example assumes, for simplicity, that each block 135 in the error catch memory 134 has a sufficient size to store each block of memory DQ1–DQ4 from the device 107. As noted above, the error catch memory 134 preferably includes multiple smaller blocks of memory that can be combined to accommodate various size blocks of memory in a given device being tested.

Figure 8:
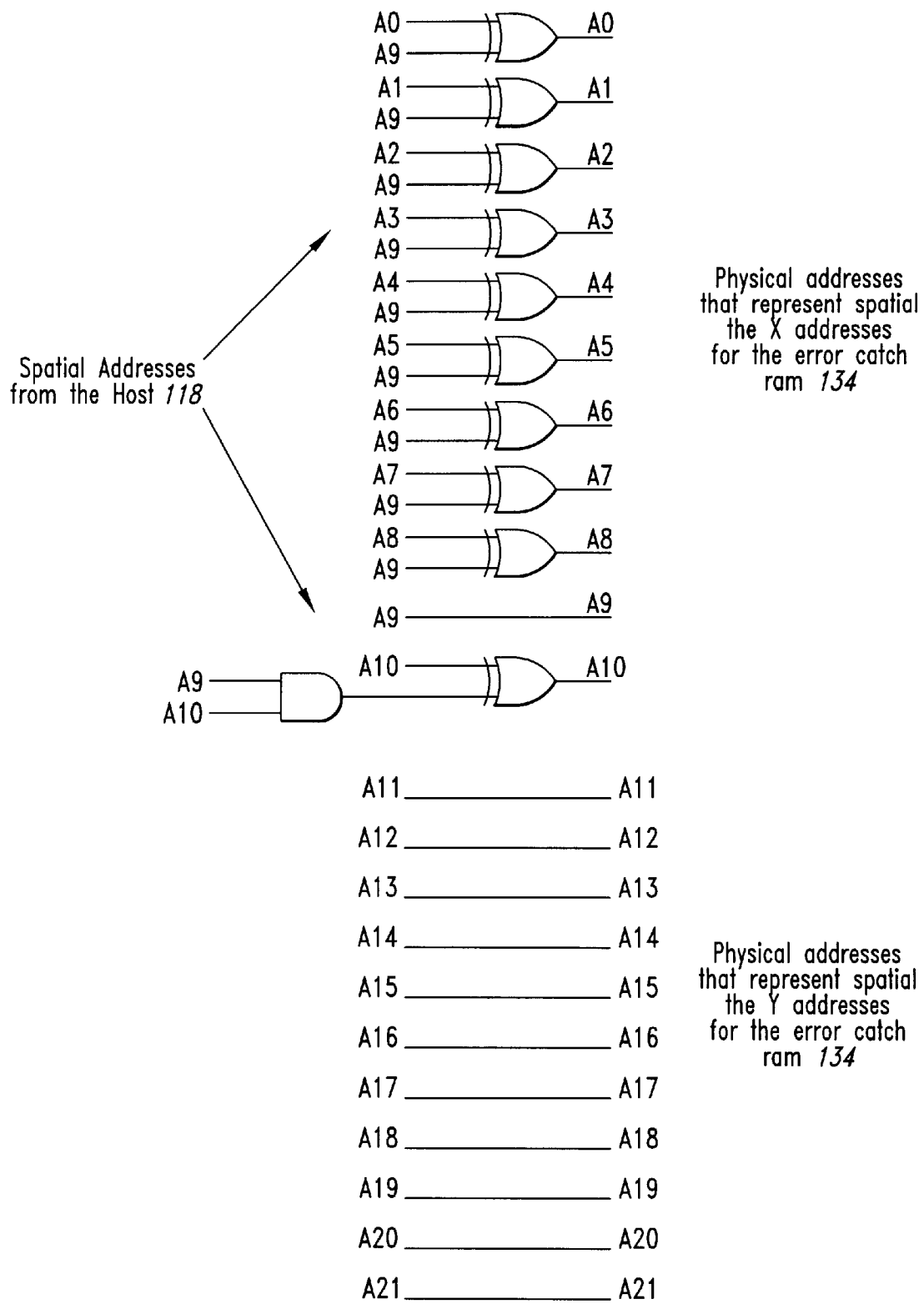
FIG. 8 is a schematic diagram of a logical gate array programmed into the topological circuitry of FIG. 4 by the host computer.

Referring to FIG. 8, the topological circuitry 136 is similarly programmed by the host computer 118 to emulate arrays of logic gates necessary for routing physical addresses in the error catch memory 134 to spatial addresses for displaying error data on the display 120. FIG. 8 shows a series of nine 2-input exclusive OR gates that each receive the address A9 and one of the addresses A0–A8. A tenth exclusive OR gate receives the address A10 and the output of an AND gate that receives at its inputs the addresses A9 and A10. The remaining addresses A9 and A11–A21 are routed directly through the topological circuitry 136 from the error catch memory 134 to the host computer 118.

As a result, the ten exclusive OR gates produce address values A0–A8 and A10, that with the address values A9 and A11–A21, are input to the error catch memory 134 for addressing memory therefrom in a serial manner consistent with addresses received from the host computer 118 (typically based on the layout of the video memory). In other words, the logic gates of FIG. 8 implemented by the topological circuitry 136 address the appropriate portions of the error catch memory 134 for direct bitmap display of the error data on the display device 120 in response to serially incremented addresses received by the host computer 118.

The particular configuration of exclusive OR gates of FIG. 8 programmed by the host computer 118 into the topological circuitry 136 compensates for or maps the mirroring layout of row addresses for blocks in the device 107. As explained above, the row addresses 0–511 for DQ1 are mirrored for DQ3 about the dashed line in FIG. 5. By simply exclusive ORing the tenth significant address bit (A9) with each of the less significant address bits (A0–A8), the topological circuitry 136 can access the error data in the error catch memory 134 in a serial manner with a string of incremented addresses input by the host computer 118 for display of data on the display device 120. Since the column addresses are not mirrored, direct routing of address lines A11–A21 are performed by the topological circuitry 136.

Figures 9, 10:
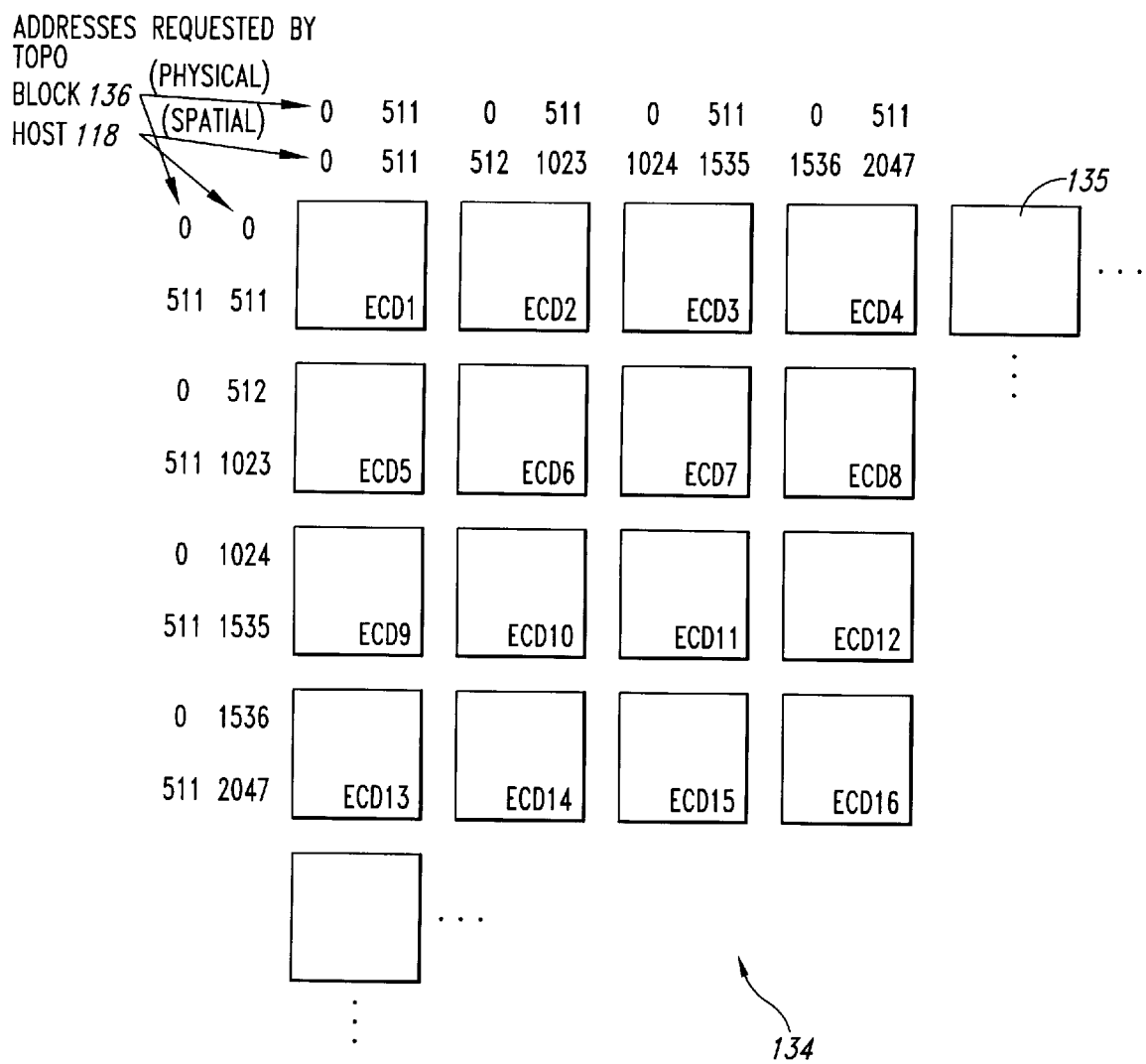
FIG. 9 shows how data lines are routed by the topological circuit of FIG. 4 from the error catch memory to the host computer.
FIG. 10 is a block diagram of the error catch memory of FIG. 2, which shows the physical and spatial addresses for the memory cells in the memory which are addressed by a host computer of the testing apparatus of FIG. 1, through the topological circuitry of FIG. 4.

The example of FIG. 8 assumes that the video memory employed for spatially addressing bitmap locations on the display device 120 is performed in a direct, serially incremented manner of addresses for an initial binary row and column addresses of 000000000 (for addresses A0–A10 and A11–A21, respectively) to the maximum spatial address for the display device 120. Therefore, as shown in FIG. 9, the error data from the error catch memory 134 can be remapped to portions of the video memory in the host computer 118. For the above-described example, error data from each block EDC1–EDC16 is directly routed to blocks of video data VD1–VD16. As shown along the top and left side of the error catch memory 134 in FIG. 10, the topological circuitry 136 stores the error data in blocks of memory EDC1–EDC 16 that each have physical row and column addresses of 0–511. The spatial addresses requested by the host computer 118 for displaying error data on the display 120, however, are shown as serially incrementing, in row and column fashion, from 0 to 2047. As explained above, the topological circuitry 136 maps the physical addresses to the spatial addresses. Of course, the topological circuitry 136 can be programmed in alternate ways by the host computer 118 to provide mapping appropriate for various displays 120 and video memory used in bitmapping the display.

Figure 11:
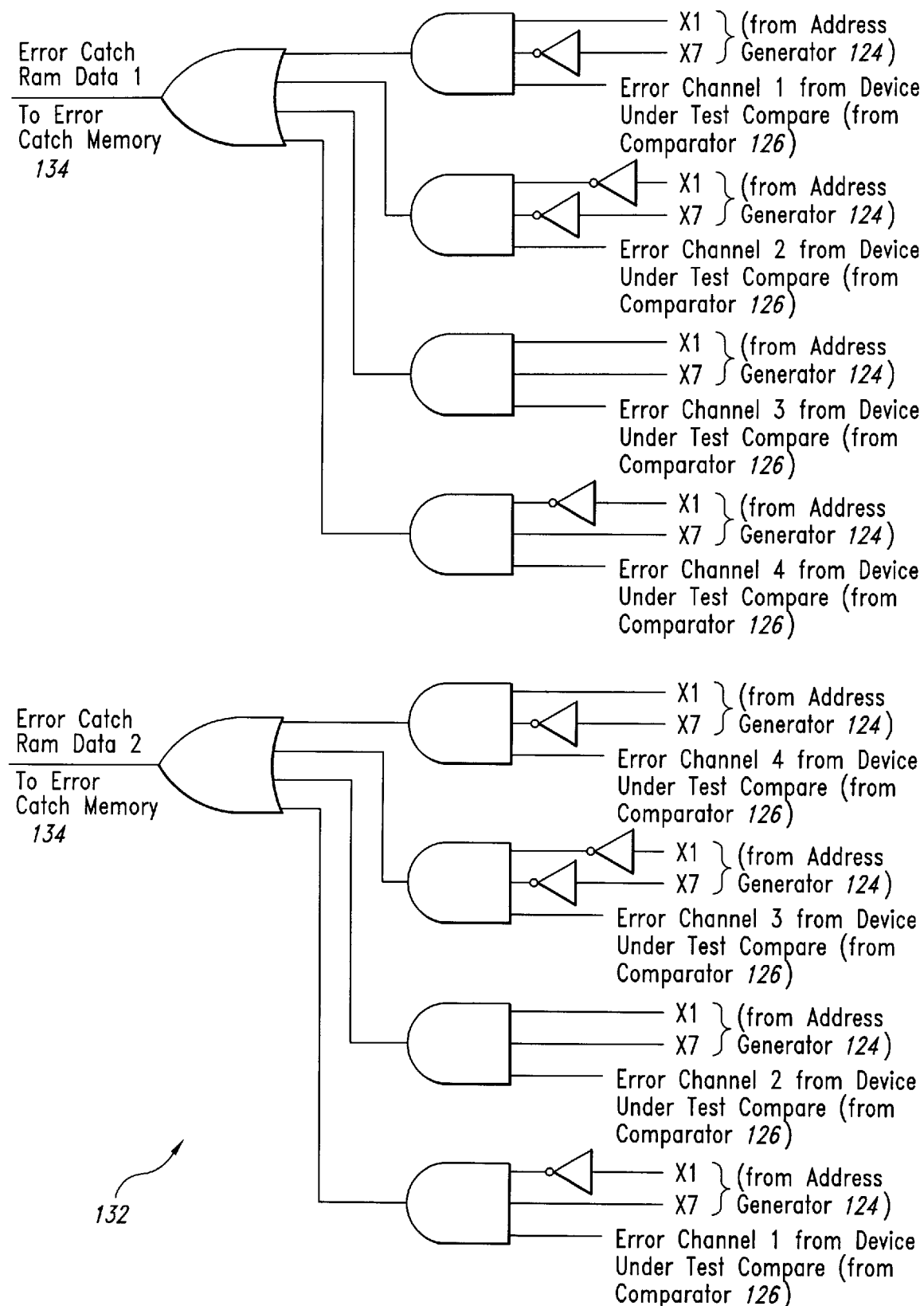
FIG. 11 is a schematic diagram showing an example of another logical gate array that can be programmed into the router circuitry of FIG. 3 by the host computer.

As explained above, the router and topological circuitry 132 and 136 can be programmed by the host computer 118 to emulate various logic gate networks and thereby rapidly route and/or map error data to and from the error catch memory 134. FIG. 11 shows an example of another logic gate network that can be emulated by the router circuitry 132. The example of FIG. 11 shows two of four sets of logic gates, where each set includes four 3-input AND gates whose outputs are provided to a 4-input OR gate. Two of the three inputs to the AND gates are the second and eighth significant address bits (shown as "X1" and "X7" for row logical addresses), while a third input is error data from one of the four memory arrays DQ1–DQ4. The address inputs are either inverted or not inverted so that each AND gate receives a different combination of two address inputs. As a result, each of the four sets of logic gates provides error data from each of the four memory cell arrays DQ1–DQ4 in the device 107 to the error catch memory 134. The example of FIG. 11 is directed to a semiconductor memory device (not shown) having more complex layout than that shown in FIG. 5.

Figure 12:
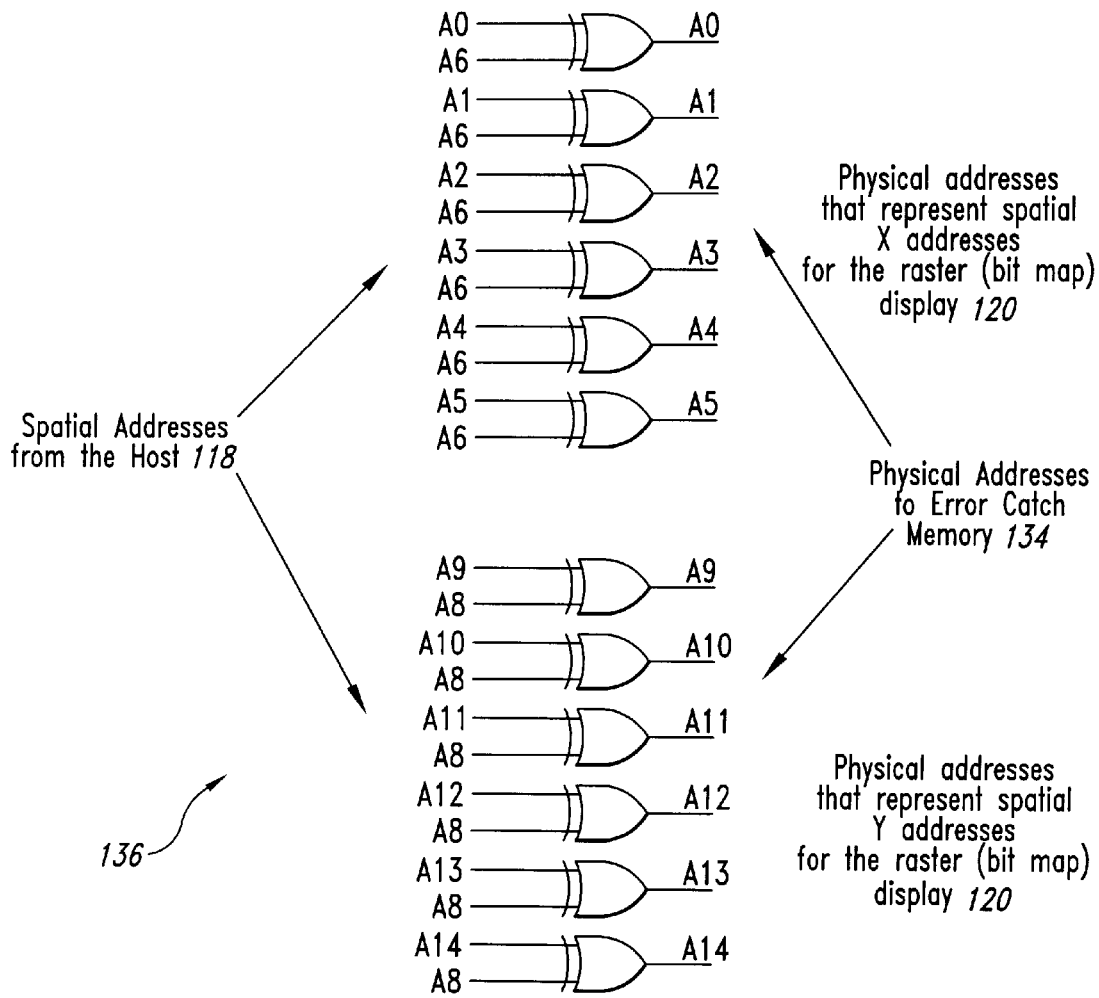
FIG. 12 is a schematic diagram of an example of another logical gate array tat can be programmed into the topological circuitry of FIG. 4 by the host computer.

A FIG. 12 similarly shows another example of logic gates that can be emulated in the topological circuitry 136 by the host computer 118. The example of FIG. 12 is directed to a semiconductor memory device where the lower significant address bits are mirrored with the address bit A6, while the higher significant address bits are mirrored with respect to address bit A8.

Figure 13:
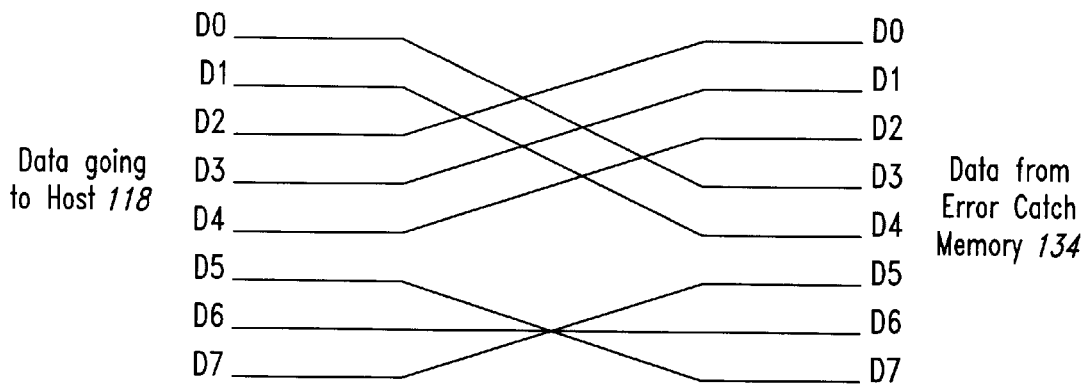
FIG. 13 shows an example of how data lines can be redirected by the topological circuit of FIG. 4 from the error catch memory to the host computer.

FIG. 13 shows an example of how the topological circuitry 136 can reroute the data lines from the error catch memory 134 to the host computer 118. The example of FIG. 13 is particularly directed to intertwined DQ lines where the layout of arrays of data cells in the error catch memory 134 differs from the layout of memory cell arrays in the video memory of the host computer 118. The examples of FIGS. 10–13 are only provided by way of example to help those skilled in the art recognize the various alternative configuration of logic gates and data line rerouting that can be programmed into the router circuitry 132 and the topological circuitry 136 by the host computer 118, and such examples do not relate to the previously described examples of FIGS. 5–9.

Figure 14:
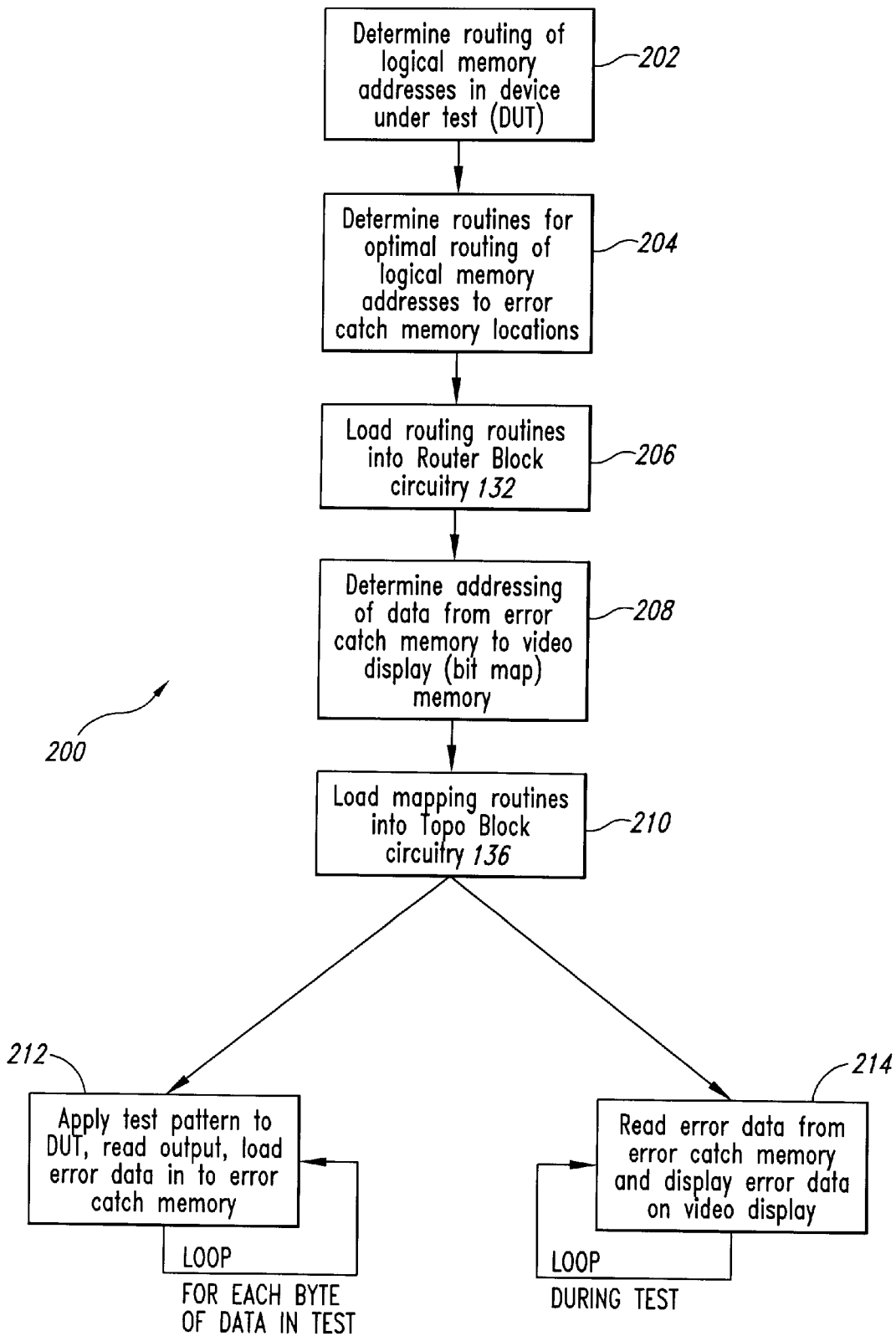
FIG. 14 is a flow chart showing the preferred steps performed by the testing apparatus of FIG. 1.

The testing apparatus 100 of the present invention is preferably performed under direction of a routine stored in and running on the host computer 118. Referring to FIG. 14, a preferred routine 200 performed by the testing apparatus 100 begins in step 202 where the host computer 118 determines the routing pattern for the logical memory addresses in the device being tested, such as the device 107. The host computer 118 preferably includes a mass storage device (not shown) for storing routing information for various types of devices to be tested by the apparatus 100 (e.g., various types of memory devices). If the host computer 118, however, does not have a previously stored routing, then the user must analyze the layout of logical addresses for the device then being tested.

In step 204, the host computer 118 determines which of many routing routines stored in the mass storage are optimal for routing the logical memory addresses for the device 107 to the error catch memory 134. Again, the host computer 118 preferably has stored in mass storage a large number of routing routines, and their corresponding logical gate arrays for implementing these routines. If the host computer 118 does not have an appropriate optimal routing routine stored in its mass storage, then the user must compare the layout of logical addresses in the device 107 to the layout of the blocks of memory 135 in the error catch memory 134 to determine an optimal routing for the logical addresses to physical addresses in the error catch memory. Thereafter, the user must determine what configuration of logic gates will provide such a routing. In step 206, the host computer 118 loads the selected optimal routing routine into the routing circuitry 132 so as to implement the routing routine in an array of logic gates (such as the gates shown in FIG. 7).

In step 208, the host computer 118 determines the mapping of error data in the error catch memory 134 to spatial addresses or addresses in video display memory, and selects the appropriate routing routine. If no such routine is stored in mass storage, then the user must determine the appropriate routine and its configuration in logic gates. In step 210, the host computer 118 loads the mapping routine into the topological circuitry 136 (such as that shown in FIGS. 8 and 9).

In step 212, the host computer 118 applies a user selected test pattern to the device 107 (through the address generator 124, timing and control circuit 128 and device under test interface 116). In step 212, the host computer 118 also causes the data to be read out from the device 107, compared to the written data (through the error comparator 126) and causes the error data to be loaded into the error catch memory 134 by means of the router circuitry 132. The step 212 continually loops during testing for each address and each bit, nibble, byte or set of data in the test pattern for the device 107.

Simultaneous with step 212, the host computer 118 in step 214 causes the error data to be read from the error catch memory 134, through the topological circuitry 136. The error data read from the error catch memory 134 is then displayed on the display 120 to thereby display, in real time, errors discovered or forced in the device 107. The step 214 is continually performed during the test to continually display errors, even as certain parameters of signals applied to the device 107 are changed.

The present invention is described above as implementing the router and topological circuitry 132 and 136 as FPGAs. In an alternative embodiment, the router and topological circuitry 132 and 136 can be implemented as lookup tables stored in certain programmable memories such as PROM, electrically erasable programmable read-only memory ("EEPROM"), flash memory, etc. Such lookup tables, rather than employing a routine implemented in logic gates, simply reroute or remap the logical addresses of the device 107 to corresponding physical addresses (for the router circuitry 132), or physical addresses to spatial addresses (for the topological circuitry 136). The lookup table in the router circuitry 132 essentially stores the translation of logical to physical addresses as shown along the top and left side of FIG. 5, while the lookup table in the topological circuitry 136 essentially stores the translation of physical to spatial addresses shown along the top and left side of FIG. 10.

For example, the lookup table in the router circuitry 132 can reflect that the memory location 140 (FIG. 5) having a logical row and column address of (384,640) in the fourth memory array DQ4 has a physical row and column address of (1152,896). As a result, the lookup table can, in hardware, rapidly map the one megabit by four device 107 of FIG. 5 to a four megabit memory emulated in the error catch memory 134. The alternative embodiment employing lookup tables, however, may require more processor time by the host computer 118, and therefore may be slightly slower than the previously described embodiment employing FPGAs.

Overall, the present invention has been described above with respect to an exemplary embodiment for a one megabit by four device 107 being tested. The router and topological circuitry 132 and 136 can emulate logic gates having a greater or lesser number of addresses depending upon the size of the device 107 being tested, the size and layout of the error catch memory 134 and the video memory, and the number of bytes of error data that can be transferred at one time. Therefore, while sixteen error channels EDC1–EDC16 are described above for the four memory cell arrays DQ1–DQ4, and sixteen error catch RAM data blocks respectively receive error data from such arrays, a greater or lesser number of channels from the device 107 being tested can be received by the router circuitry 132, and the router circuitry can output a greater or lesser number of channels to the error catch memory 134.

The present invention allows testing to be performed quickly and automatically over a wide array of semiconductor devices. The error mapping circuitry 130 is electrically or programmably reconfigurable so as to be modified to rapidly route error data from an indefinite number of semiconductor devices that may be tested to video memory for display on a display device. In a broad sense, if the physical addresses of the error catch memory 134 can map directly to the spatial locations on the display device 120 (and thus to the video memory), then the mapping circuitry 130 of the present invention can be implemented with only the router circuitry 132 and the error catch memory 134.

While the detailed description has been expressed, in part, in terms of specific examples, those skilled in the art will appreciate that many other variations could be used to accomplish the purpose of the disclosed invention. For example, those skilled in the art will recognize that while the present invention described above for testing memory circuits, the invention can be readily adapted to test other semiconductor devices or circuitry. Accordingly, it can be appreciated that equivalent modifications to the above-described embodiments can be made without departing from the spirit and scope of the invention. Therefore, the present invention is limited only by the following claims.

What is claimed is:

1. In a testing system having a processor and an output device, an apparatus for identifying errors in a semiconductor device, wherein the semiconductor device has a plurality of circuit locations addressable by logical addresses, the apparatus comprising:

an error memory for storing error data corresponding to a comparison between data applied to the plurality of circuit locations in the semiconductor device and data read from the plurality of circuit locations, wherein the error memory is addressable by physical addresses; and a programmable router circuit coupled to the error memory and the semiconductor device, wherein the programmable router circuit converts the logical addresses to physical addresses and causes the error data from the plurality of circuit locations in the semiconductor device to be routed to selected locations in the error memory, wherein the error memory provides error data corresponding to selected physical addresses to the processor in response to spatial addresses from the processor, and wherein the error data corresponds to the spatial addresses capable of being visually output by the output device.

2. The apparatus of claim 1 wherein the programmable router circuit is a field programmable gate array, and wherein the field programmable gate array is programmable by the processor based on a layout of the circuit locations in the semiconductor device.

3. The apparatus of claim 1 wherein the programmable router circuit is a field programmable gate array.

4. The apparatus of claim 1, further comprising a programmable circuit programmable by the processor based on a layout of memory locations in the error memory.

5. The apparatus of claim 1 wherein the programmable router circuit is a programmable read only memory that stores a look-up table for converting the logical addresses to physical addresses.

6. The apparatus of claim 1, further comprising a programmable read only memory that stores a look-up table for converting spatial addresses to physical addresses.

7. A testing apparatus for testing a semiconductor device formed on a substrate, the semiconductor device having a plurality of circuits addressable by logical addresses, the apparatus comprising:

a processor and display device capable of providing test data to and from the plurality of circuits in the semiconductor device based on the logical addresses;

a comparator circuit coupled to the semiconductor device for comparing the test data provided to the plurality of circuits to the data from the plurality of circuits and producing error data in response to such comparison, and wherein the processor and display device is capable of displaying the error data at spatial addresses; and a mapping circuit having an error memory for storing the error data, wherein the error memory is addressable by physical addresses, a programmable router circuit coupled to the processor, the comparator circuit, and the error memory, wherein the programmable router circuit converts the logical addresses to physical addresses and causes the error data to be routed to selected locations in the error memory, and wherein the error memory provides error data corresponding to physical addresses for display by the processor and display device.

8. The testing apparatus of claim 7, further comprising:

a test bed for releasably securing the substrate; and a plurality of test probes for electrically intercoupling between the semiconductor device and the processor.

9. The testing apparatus of claim 7, further comprising a magnifying optical inspection device positioned over the substrate for allowing optical inspection of an upper surface of the substrate.

10. The apparatus of claim 7 wherein the programmable router circuit is a field programmable gate array.

11. The apparatus of claim 7 wherein the programmable router circuit is a field programmable gate array, and wherein the field programmable gate array is programmable by the processor and display device based on a layout of the circuits in the semiconductor device.

12. The apparatus of claim 7, further comprising a field programmable gate array, programmable by the processor and display device based on a layout of the memory locations in the error memory.

13. The apparatus of claim 7 wherein the programmable router circuit is a programmable read only memory that stores a look-up table for converting the logical addresses to physical addresses.

14. The apparatus of claim 7, further comprising a programmable read only memory that stores a look-up table for converting spatial addresses to physical addresses.

15. A method of testing a semiconductor device and outputting locations of errors in the semiconductor device, the semiconductor device having a plurality of locations addressable by logical address signals, the method comprising the steps of:

programming a router for converting the logical addresses of the semiconductor device to physical addresses based on a layout of the locations in the semiconductor device;

programming a converter for converting spatial addresses to physical addresses based on a layout of a plurality of memory locations in an error memory;

applying test signals to the semiconductor device, determining error data from the semiconductor device and routing the error data to the error memory based on the programmed router; and reading the error data from the error memory and visually outputting the error data at spatial locations based on the programmed converter.

16. The method of claim 15, further comprising the steps of:

determining a pattern for the logical address signals for the locations in the semiconductor device, and determining an optimal routing routine for converting the logical addresses of the semiconductor device to physical addresses based on the pattern for the logical address signals of the locations in the semiconductor device.

17. The method of claim 15, further comprising the steps of:

determining a pattern for addresses of the memory locations in the error memory, and determining an optimal mapping routine for mapping the spatial addresses to physical addresses based on the pattern for the addresses of the memory locations in the error memory.

18. The method of claim 15 wherein the step of programming a router includes loading a routine into a field programmable gate array.

19. The method of claim 15 wherein the step of programming a converter includes loading a routine into a field programmable gate array.

20. The method of claim 15 wherein the step of programming a router includes loading a routine into a read only memory that stores a look-up table for converting the logical addresses to physical addresses.

21. The method of claim 15 wherein the step of programming a converter includes loading a routine into a read only memory that stores a look-up table for converting spatial addresses to physical addresses.

22. A testing system for testing a semiconductor memory device, the testing system having a computer and a display device, and the memory device being addressable by logical addresses, the system comprising:

an error catch memory for storing error data corresponding to a comparison between written and read data to and from the memory device, each memory cell of the catch memory being addressable by a physical address;

a programmable router circuit coupled to the catch memory and the memory device, for converting the logical addresses to physical addresses, and routing for storage of the error data from the locations within the memory device to selected memory cells within the catch memory; and a programmable topological circuit coupled to the catch memory and computer, the topological circuit receiving spatial addresses from the computer, converting the spatial addresses to selected physical addresses, and providing error data corresponding to the selected physical addresses to the computer in response to the spatial addresses to allow the error data from the memory device to map to spatial addresses on the display device for displaying the locations of errors in the memory device.

23. A method comprising the steps of:

loading a routing routine, based on a layout of memory locations in a memory device, which converts logical addresses of the memory device to physical addresses;

loading a mapping routine, based upon a layout of a plurality of memory cells within an error catch memory, into a topological circuit for converting spatial addresses to physical addresses;

continually applying a test pattern to the memory device, determining error data from the memory device and routing it to the catch memory based on the routing routine; and substantially simultaneously with the step of applying a test pattern, constantly reading the error data from the catch memory and displaying the error data at spatial locations on a display device based upon the mapping routine.

* * * * *

UNITED STATES PATENT AND TRADEMARK OFFICE
CERTIFICATE OF CORRECTION

PATENT NO. : 6,134,677  
DATED : October 17, 2000  
INVENTOR(S) : Brent Lindsay

Page 1 of 1

It is certified that error appears in the above-identified patent and that said Letters Patent is hereby corrected as shown below:

<u>U.S. PATENT DOCUMENTS,</u>
"4,857,833    8/1989    Gonzlez et al. .....324/79 R"
-- 4,857,833    8/1989    Gonzalez et al. .,...324/79 R --

Signed and Sealed this

Fifth Day of February, 2002

Attest:

Attesting Officer

JAMES E. ROGAN  
Director of the United States Patent and Trademark Office